(12) United States Patent
Northcutt et al.

(10) Patent No.: US 9,791,503 B1
(45) Date of Patent: Oct. 17, 2017

(54) PACKAGED OSCILLATORS WITH BUILT-IN SELF-TEST CIRCUITS THAT SUPPORT RESONATOR TESTING WITH REDUCED PIN COUNT

(71) Applicant: Integrated Device Technology, Inc., San Jose, CA (US)

(72) Inventors: James Bryan Northcutt, Lehigh Acres, FL (US); Stephen Amar Tibbitts, Spanaway, WA (US); Robert A. Gubser, Arlington, WA (US); Bruce Edward Clark, Puyallup, WA (US); John William Fallisgaard, Lake Forest Park, WA (US); Kenneth Astrof, Edmonds, WA (US)

(73) Assignee: Integrated Device Technology, Inc., San Jose, CA (US)

( * ) Notice: Subject to any disclaimer, the term of this patent is extended or adjusted under 35 U.S.C. 154(b) by 133 days.

(21) Appl. No.: 14/871,411

(22) Filed: Sep. 30, 2015

(51) Int. Cl.
  *G01R 31/3187* (2006.01)
  *G01R 31/28* (2006.01)
  *H03B 5/32* (2006.01)

(52) U.S. Cl.
  CPC ....... *G01R 31/2884* (2013.01); *G01R 31/282* (2013.01); *G01R 31/2836* (2013.01); *G01R 31/2853* (2013.01); *H03B 5/32* (2013.01)

(58) Field of Classification Search
  CPC .............. G01R 31/2884; G01R 31/282; G01R 31/2853; G01R 31/2836; H03B 5/32
  USPC ............................... 324/750.3, 331, 327, 537
  See application file for complete search history.

(56) References Cited

U.S. PATENT DOCUMENTS

| | | | |
|---|---|---|---|
| 7,034,441 B2 | 4/2006 | Ono et al. | |
| 7,082,067 B2 * | 7/2006 | Venkatraman | G11C 29/50 365/154 |
| 7,205,854 B2 * | 4/2007 | Liu | G01R 31/31727 324/750.3 |
| 7,872,537 B2 | 1/2011 | Tanaka | |
| 8,095,104 B2 * | 1/2012 | Kawae | G06F 1/04 331/186 |
| 8,729,968 B2 | 5/2014 | Hsieh et al. | |
| 2003/0184315 A1 * | 10/2003 | Eberlein | H03K 3/011 324/658 |
| 2003/0210028 A1 * | 11/2003 | Beach | G01R 31/2882 324/76.16 |
| 2005/0210352 A1 | 9/2005 | Ricchetti et al. | |
| 2005/0223289 A1 | 10/2005 | Ho | |
| 2006/0058973 A1 | 3/2006 | Chen | |

(Continued)

*Primary Examiner* — Giovanni Astacio-Oquendo
(74) *Attorney, Agent, or Firm* — Myers Bigel, P.A.

(57) ABSTRACT

Packaged integrated circuit devices include an oscillator circuit having a resonator (e.g., quartz crystal, MEMs, etc.) associated therewith, which is configured to generate a periodic reference signal. A built-in self-test (BIST) circuit is provided, which is selectively electrically coupled to first and second terminals of the resonator during an operation by the BIST circuit to test at least one performance characteristic of the resonator, such as at least one failure mode. These test operations may occur during a built-in self-test time interval when the oscillator circuit is at least partially disabled. In this manner, built-in self-test circuitry may be utilized to provide an efficient means of testing a resonating element/structure using circuitry that is integrated within an oscillator chip and within a wafer-level chip-scale package (WLCSP) containing the resonator.

17 Claims, 4 Drawing Sheets

(56) References Cited

U.S. PATENT DOCUMENTS

| | | |
|---|---|---|
| 2007/0182496 A1 | 8/2007 | Wallberg et al. |
| 2007/0280032 A1* | 12/2007 | Kwak ................ G01R 31/3016 |
| | | 365/233.5 |
| 2008/0077831 A1 | 3/2008 | Sasaki et al. |
| 2011/0161758 A1 | 6/2011 | Whetsel |
| 2013/0038366 A1 | 2/2013 | Tsai et al. |
| 2014/0256376 A1 | 9/2014 | Weissman et al. |
| 2014/0281778 A1 | 9/2014 | Ahmed et al. |
| 2015/0074475 A1 | 3/2015 | Anzou |

* cited by examiner

PACKAGED OSCILLATORS WITH BUILT-IN SELF-TEST CIRCUITS THAT SUPPORT RESONATOR TESTING WITH REDUCED PIN COUNT

REFERENCE TO RELATED APPLICATIONS

This application is related to U.S. application Ser. No. 14/015,471, filed Aug. 30, 2013, U.S. application Ser. No. 14/136,040, filed Dec. 20, 2013; U.S. application Ser. No. 14/586,508, filed Dec. 30, 2014, entitled "Integrated Circuit Device Substrates Having Packaged Crystal Resonators Thereon," U.S. application Ser. No. 14/586,525, filed Dec. 30, 2014, entitled "Integrated Circuit Device Substrates Having Packaged Inductors Thereon," and U.S. application Ser. No. 14/586,534, filed Dec. 30, 2014, entitled "Crystal Oscillator Fabrication Methods Using Dual-Deposition of Mounting Cement and Dual-Curing Techniques," the disclosures of which are hereby incorporated herein by reference in their entirety.

FIELD OF THE INVENTION

The present invention relates to integrated circuit devices and, more particularly, to oscillator circuits and methods of testing same.

BACKGROUND OF THE INVENTION

State-of-the-art oscillator circuits have been developed to include resonating elements within wafer-level chip-scale packaging (WLCSP). Unfortunately, the oscillator circuits containing such packaged resonating elements typically do not support commercially viable access to test points associated with the resonating elements. Moreover, many types of resonating elements exhibit failure modes that cannot be detected through functional testing of the oscillator circuits. Historically, these failure modes have been detected by probing directly across a resonating element, such as a MEMs, quartz-crystal or other piezo-electric element. Specifically, in the case of quartz crystals, the common failure modes are typically identified through the measurement of resistance level dependency (RLC) and drive level dependency (DLD). As will be understood by those skilled in the art, issues identified through RLD and DLD screening can vastly improve the long-term reliability of products containing quartz resonating structures. However, due to the small sizing of typical WLCSP and customer preferences for minimizing the number of functional pads, WLCSP no longer allows for direct connection to the resonating element by conventional test equipment.

SUMMARY OF THE INVENTION

Packaged integrated circuit devices according to some embodiments of the invention include an oscillator circuit having a resonator associated therewith, which is configured to generate a periodic reference signal. This resonator may be selected from a group consisting of quartz crystals, microelectromechanical resonators, bulk-acoustic and surface-acoustic wave (SAW) resonators, and piezoelectric elements, for example, and may, in some cases, be integrated within the same package with other elements of the oscillator circuit. A built-in self-test (BIST) circuit is also provided, which is selectively electrically coupled to first and second terminals of the resonator during an operation by the BIST circuit to test at least one performance characteristic of the resonator, such as at least one failure mode. These test operations may occur during a built-in self-test time interval when the oscillator circuit is at least partially disabled. In this manner, built-in self-test circuitry may be utilized to provide an efficient means of testing a resonating element/structure using circuitry that is integrated within an oscillator chip and within a wafer-level chip-scale package (WLCSP) containing the resonator. Typically, the built-in self-test circuitry will contain a relatively small set of circuits that provide the control, stimulation, measurement and go/no-go decision on the health of the resonator during a power-up phase of the oscillator circuit. The built-in self-test circuitry may also be extended to higher frequency modes for spurious and margin testing.

According to additional embodiments of the invention, the operation by the BIST circuit to test for a presence of at least one failure mode can be selected from a group consisting of resistance level dependency (RLD) screening and drive level dependency (DLD) screening. Moreover, the operation to test for a presence of at least one failure mode can be commenced (e.g., automatically) during an operation to power-up the oscillator circuit. Typically, during the operation to test for a presence of at least one failure mode, the resonator is temporarily functionally disconnected from other components of the oscillator circuit.

In some further embodiments of the invention, during the test operation the BIST circuit may make a go/no-go decision as to at least one performance characteristic of the resonator. In particular, the operation to test for a presence of at least one failure mode may include measuring a first characteristic of the resonator under first test conditions and measuring a corresponding first characteristic of a reference element under otherwise equivalent first test conditions. For example, the operations to measure a first characteristic of the resonator under first test conditions may include measuring a first characteristic of the resonator under first test conditions using a first test circuit containing the resonator therein. In addition, the operations to measure a corresponding first characteristic of a reference element (e.g., resistor) under equivalent first test conditions may include measuring a corresponding first characteristic of the reference element under equivalent first test conditions using the first test circuit, with the reference element replacing the resonator therein. Thereafter, upon completion of the operation to test for a presence of at least one failure mode, the resonator is functionally reconnected to the other components of the oscillator circuit to thereby resume normal operation.

DETAILED DESCRIPTION OF EMBODIMENTS

Figure 1A:
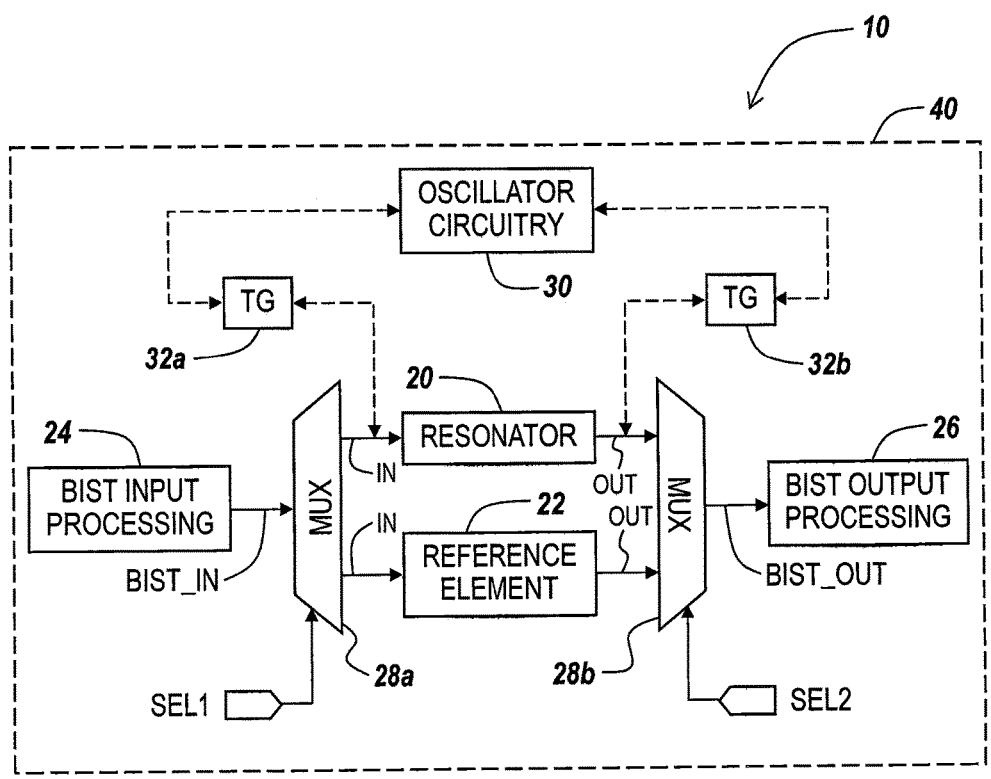
FIG. 1A is a block diagram of a packaged integrated circuit device with built-in self-test (BIST) circuitry, according to embodiments of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1A, a packaged integrated circuit device 10 with built-in self-test (BIST) circuitry is illustrated as including an oscillator circuit for generating one or more periodic reference signals, for example, which may be used for timing and synchronization purposes by other surrounding integrated circuitry (not shown) embodied within an integrated circuit chip. In the illustrated embodiment of FIG. 1A, the oscillator circuit is illustrated as including oscillator circuitry 30, which during normal modes of operation is electrically coupled to and responsive to an output signal(s) generated by a resonator 20 in response to a stimulus (e.g., input signal) provided by the oscillator circuitry 30. As shown by a pair of dotted lines, a pair of transmission gates (TG) 32a, 32b may be controlled to selectively connect/disconnect input and output terminals of the resonator to/from the oscillator circuitry 30 during the normal and test modes of operation described herein. The resonator 20 will be treated herein as a crystal oscillator having a pair of input and output terminals, however, other configurations of resonator and resonating elements may be used as will be appreciated by those of ordinary skill in the art of oscillator circuit design.

Figure 2A:
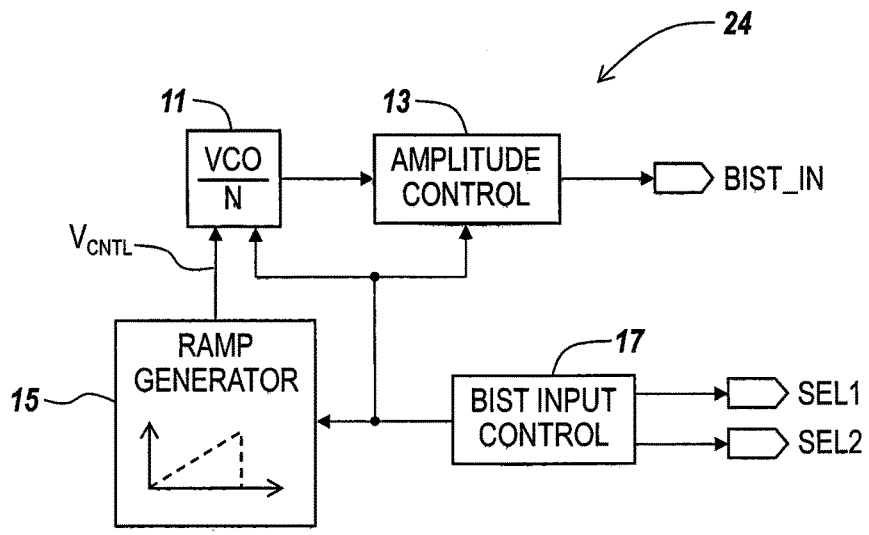
FIG. 2A is a block diagram of a BIST input processor, which may be used in the packaged integrated circuit device of FIG. 1A to perform operations illustrated by FIG. 1B.

As further shown by FIG. 1A, built-in self-test (BIST) circuitry may be provided within the same package 40 as the oscillator circuit 20, 30. In one embodiment of the packaged integrated circuit device 10, the BIST circuitry includes BIST input and output processors 24, 26, input and output multiplexers 28a, 28b, which are responsive to respective select/control signals (SEL1, SEL2) generated by the input processor 24, and a two-terminal reference element 22, which will be treated herein as a relatively high precision resistor of known value (e.g., 30 ohms). In some embodiments of the invention, a resistance of the reference element 22 may be matched to an effective series resistance (ESR) of the resonator 20, when modeled (at resonance) as a series RLC circuit. However, in other embodiments of the invention, the resistance of the reference element 22 may differ from the ESR of the resonator 20 because at least one function of the reference element 22 is to support calibration for the BIST measurements described hereinbelow and obviate a need for absolute accuracy of components in the BIST measurement path, which, as illustrated by FIGS. 1A, 2A and 2C, include an amplitude control circuit 13, multiplexers 28a, 28b and an analog-to-digital converter 27.

As explained more fully with respect to FIGS. 1B-2D, the BIST input processor 24 generates input test signals (e.g., BIST_IN), which are selectively routed through the input multiplexer 28a to either the resonator 20 or reference element 22 during a BIST operation. Likewise, the BIST output processor 26 receives output test signals (e.g., BIST_OUT) from either the resonator 20 or reference element 22, via the output multiplexer 28b, which is controlled by the value (e.g., 0 or 1) of the select signal SEL2.

Figure 1B:
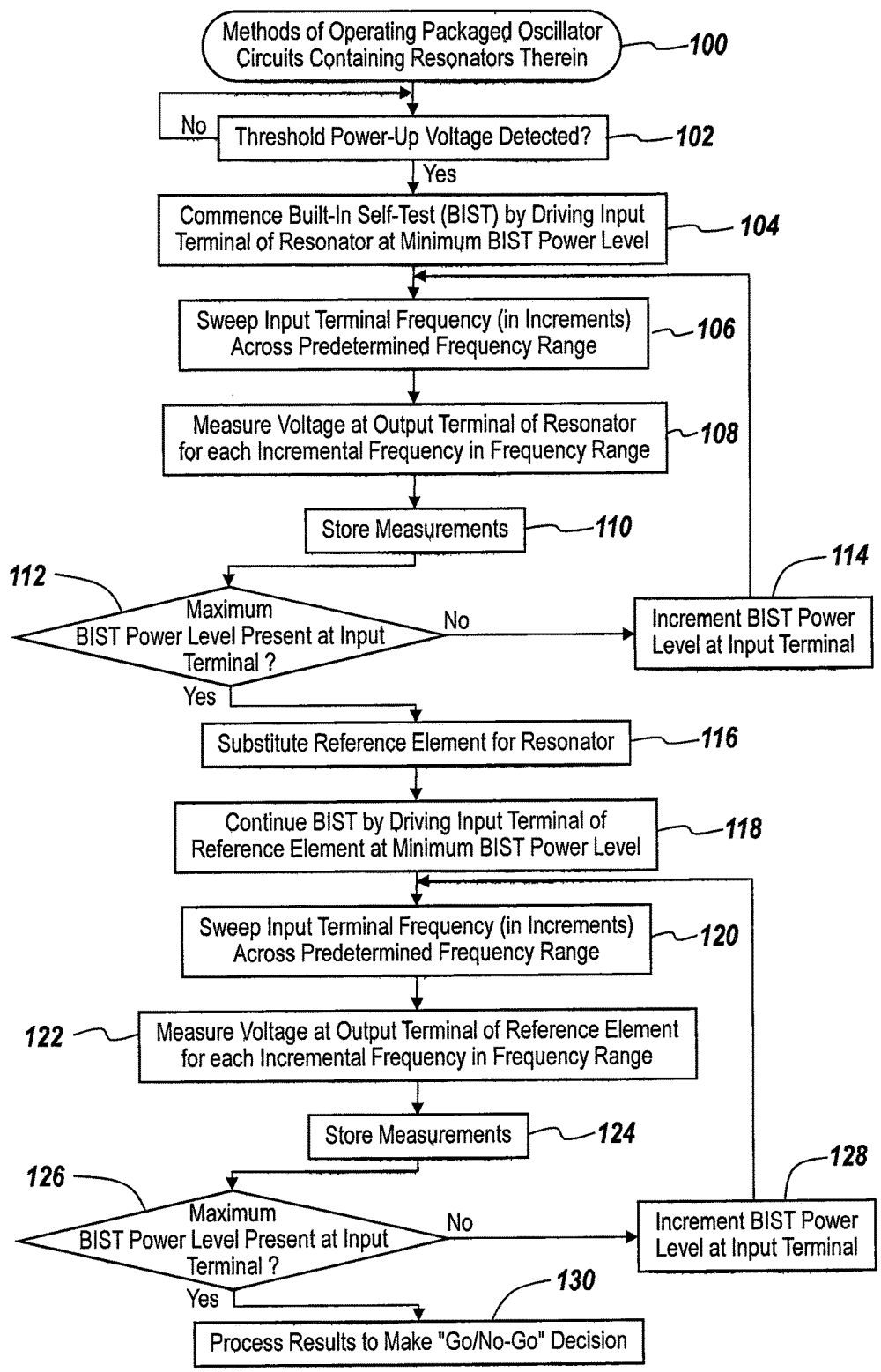
FIG. 1B is a flow diagram of operations that illustrates methods of operating packaged oscillator circuits containing resonators therein, according to embodiments of the invention.

As illustrated by FIG. 1B, test operations 100 performed by the BIST circuitry of FIG. 1A during, for example, a power-up phase of operation within the packaged integrated circuit device 10, include checking whether a sufficient power-up voltage (e.g., Vdd) is present within the package 40 to successfully perform built-in testing of the resonator 20, Block 102 (optional). Alternatively, the packaged integrated circuit device may include a microcontroller (not shown) to control startup, delays and phasing of the BIST functions described herein. For example, circuitry may be provided that can monitor an amplitude of a resonator output signal to thereby detect sufficient stability of the resonator 20 for testing purposes.

This power-up voltage check highlighted by Block 102 is typically independent of whether the oscillator circuitry 30 is otherwise adequately powered and enabled. If a threshold power-up voltage has been detected, then self-test operations can commence by electrically linking together the BIST input processor 24, resonator 20 and BIST output processor 26 using the SEL1 and SEL2 control signals and driving (via the BIST input processor 24) the input terminal of the resonator 20 at a minimum power level for testing, Block 104. During the self-test time interval, which typically commences during the power-up phase of operation, the input and output terminals of the resonator 20 remain electrically disconnected from the oscillator circuitry 30 because the transmission gates 32a, 32b are initially disposed in an "open" condition during the self-test time interval. As shown by FIG. 2D, an initial power level of 10 nW may be utilized as the minimum BIST power level identified by Block 104, however, other initial power levels may also be used that may vary as a function of resonator size, etc.

Thereafter, as shown by Blocks 106, 108 and 110 of FIG. 1B and the 10 nW frequency (f) curve of FIG. 2D, a sweep of input signals having different frequencies, which span a frequency range, is provided to the input terminal (e.g., XIN) of the resonator 20. As an example, a sweep of input frequency (f) may be provided in increments about a nominal frequency of 25 MHz (e.g., 25 MHz-3000 ppm (lowest) to 25 MHz+3000 ppm (highest)), and measurements of signals generated at the output terminal (XOUT) of the resonator 20 may be made by the BIST output processor 26 and stored internally. A typical duration of each frequency sweep of the resonator 20 may be about 100 milliseconds or longer. As shown by the uppermost 10 nW power(db)-v-frequency(f) curve of FIG. 2D, the stored data may take the form of discrete points along the curve for the selected range of frequencies. Next, as illustrated by Blocks 112 and 114 of FIG. 1B, the BIST power levels are repeatedly incremented until a maximum power level has been reached and the operations of Blocks 106-110 have been repeated for each incremental power level. The 100 nW, 1 µW, . . . 100 µW curves of FIG. 2D illustrate the stored point measurements associated with the varying power level frequency sweeps of the resonator 20, which are above minimum power level.

Next, as shown by FIG. 1A and Blocks 116-128 of FIG. 1B, the input and output multiplexers 28a, 28b of FIG. 1A may be switched so that the reference element 22 replaces the resonator 20 in the self-test path between the BIST input and output processors 24, 26. Upon making this substitution, the resonator 20 may become electrically coupled to the oscillator circuitry 30 by enabling the transmission gates 32a, 32b into a "closed" condition that approximates an electrical "short." Upon completion of the substitution, equivalent frequency sweeps at the same incremental power levels highlighted by FIG. 2D are performed on the reference element 22 and stored within the BIST output processor 26. As will be understood by those skilled in the art, the sweep speed of the reference element 22 may be much faster than the sweep speed of the resonator 20 (e.g., 1 millisecond) and the BIST_OUT signals generated during "testing" of the reference element 22 (e.g., resistor) should fall along the dotted horizontal lines shown in FIG. 2D.

Finally, as shown by Block 130 and FIG. 2D, a "go/no-go" decision can be made on the "health" of the resonator 20 by comparing the test results associated with the resonator 20 with the test results associated with the reference element 22 (e.g., resistor). Based on this comparison, an assessment can be made as to whether, at any power level (e.g., 10 nW-100 µW), a peak magnitude (e.g., in decibels (db), for example) of an output signal generated by the resonator 20 during self-testing is lower than a magnitude of the output signals generated by the reference element 22. If true, as shown by the circled "fail" condition in the 1 µW curve, the self-test represents a too high ESR (effective series resistance) associated with the resonator 20, which can be classified as a BIST failure (i.e., no-go) because a high ESR value typically makes an oscillator start-up time increase to potentially unacceptable levels. Alternatively, test results associated with the reference element 22 may be used for calibration purposes, whereas an assessment of changes between the multiple frequency sweeps of the resonator 20 (at the different power levels shown by FIG. 2D) may be used to access a go/no-go decision with respect to the resonator 20. Other algorithms may also be used to assess go/no-go, as will be understood by those skilled in the art.

Furthermore, with respect to drive level dependency (DLD) testing, which can determine a degree to which the resistance of a resonator (e.g., crystal) changes from relatively low drive power levels to relatively high drive power levels, such as during oscillator start-up, the BIST output processor 26 may determine a difference (for each power level) between the maximum peak output signal and corresponding minimum peak output signal and then compare this difference to a threshold value that may be determined based on prior in-situ calibration (e.g., in-situ resonator calibration and in-situ reference element calibration), as will be understood by those skilled in the art.

Figure 2B:
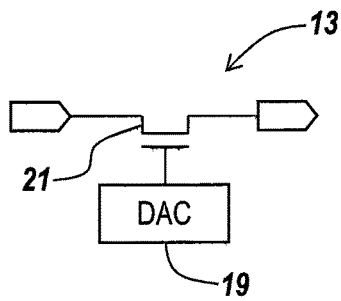
FIG. 2B illustrates an embodiment of the amplitude control circuit of FIG. 2A.
Figure 2C:
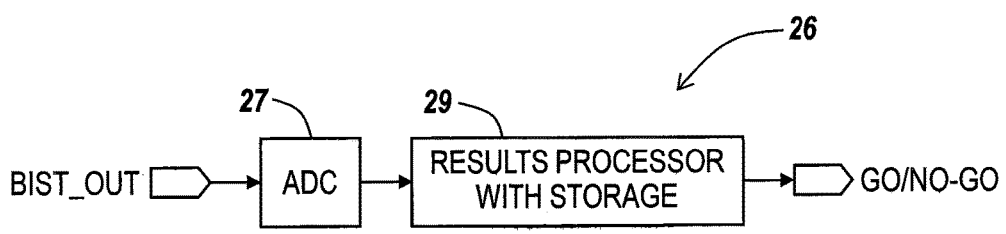
FIG. 2C is a block diagram of a BIST output processor, which may be used in the packaged integrated circuit device of FIG. 1A to perform operations illustrated by FIG. 1B.
Figure 2D:
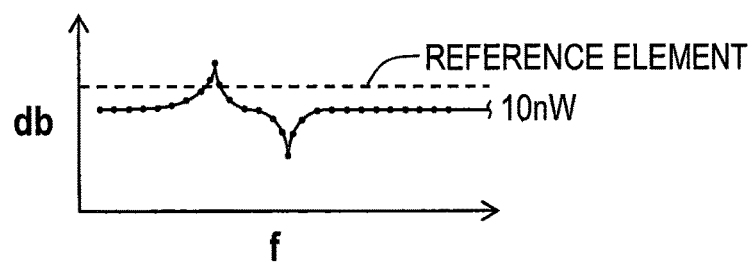
FIG. 2D illustrates a plurality of waveforms, which highlight respective frequency sweeps of the resonator of FIG. 1A at different power levels.
Figure 2D:
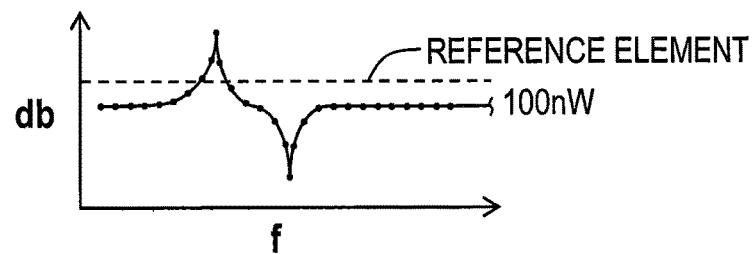
Figure 2D:
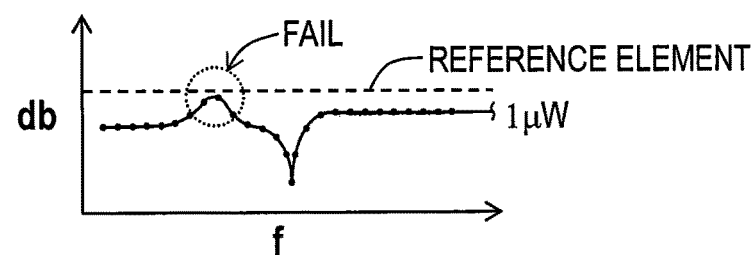
Figure 2D:
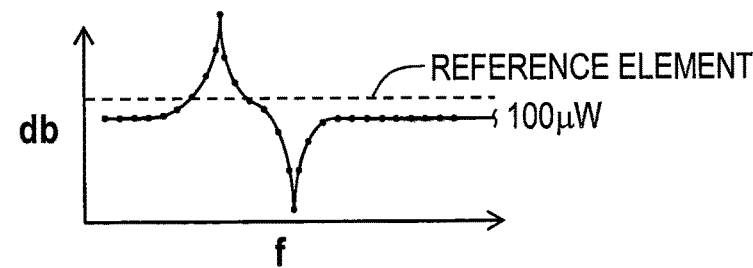

Referring now to FIGS. 2A-2B, an embodiment of a BIST input processor 24 is illustrated as including a frequency generator 11 (e.g., voltage controlled oscillator (VCO) at a reduced frequency (divide-by-N)), having an output frequency that varies in response to a varying magnitude control voltage (Vcntl) generated by a ramp generator, which supports generation of varying frequencies at an output of the frequency generator 11 across the above-described frequency range. In addition, an amplitude control circuit 13, which may include a pass transistor 21 and analog gate voltage generator 19 (e.g., digital-to-analog converter (DAC)), as shown by FIG. 2B, can be used to vary the effective power level of the BIST_IN signals generated during the above-described resonator testing. These components of the BIST input processor 24 operate in response to control signals generated by a BIST input control circuit 17, which also generates the select signals SEL1 and SEL2 to support the operations identified by FIG. 1B.

Referring now to FIG. 2C, an embodiment of the BIST output processor 26 of FIG. 1A is illustrated as including an analog-to-digital converter (ADC) 27 and a results processor (with storage) 29, which may run a test algorithm(s) on the stored measurements in order to generate a go/no-go decision on the health (e.g., functionality) of the resonator 20 and/or identify at least one performance characteristic of the resonator 20 during a built-in self-test time interval when the oscillator circuit 20, 30 is at least partially disabled by virtue of the open-state transmission gates 32a, 32b. Moreover, in the event the packaged integrated circuit device 10 includes a relatively reduced number of external pins, the results processor 29 may further drive a multi-function pin of the package 40 with data that encodes the go/no-go decision and/or performance characteristic of the resonator 20. This driving of the multi-function pin may occur during the built-in self-test time interval, which may precede normal operation of the packaged integrated circuit device 10 when the multi-function pin transmits or receives non-test data/information. In some alternative embodiments of the invention, wireless data transmission of the test results can be implemented, which may eliminate any need to utilize a pin of the package 40.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:
1. A packaged integrated circuit device, comprising:
an oscillator circuit having a resonator associated therewith, which is configured to generate a periodic reference signal; and a built-in self-test (BIST) circuit electrically coupled to first and second terminals of the resonator during an operation by said BIST circuit to test for a presence of at least one failure mode associated with the resonator.

2. The packaged integrated circuit device of claim 1, wherein the operation to test for a presence of at least one failure mode is selected from a group consisting of resistance level dependency (RLD) screening and drive level dependency (DLD) screening.

3. The packaged integrated circuit device of claim 2, wherein during the operation to test for a presence of at least one failure mode the resonator is temporarily functionally disconnected from other components of the oscillator circuit.

4. The packaged integrated circuit device of claim 3, wherein upon completion of the operation to test for a presence of at least one failure mode, the resonator is functionally reconnected to the other components of the oscillator circuit.

5. The packaged integrated circuit device of claim 1, wherein during the operation to test for a presence of at least one failure mode the resonator is temporarily functionally disconnected from other components of the oscillator circuit.

6. The packaged integrated circuit device of claim 1, wherein the operation to test for a presence of at least one failure mode is commenced during an operation to power-up the oscillator circuit.

7. The packaged integrated circuit device of claim 6, wherein during the operation to test for a presence of at least one failure mode the resonator is temporarily functionally disconnected from other components of the oscillator circuit.

8. The packaged integrated circuit device of claim 7, wherein the BIST circuit is configured to make a go/no-go decision as to at least one performance characteristic of the resonator during the operation to test for a presence of at least one failure mode.

9. The packaged integrated circuit device of claim 6, wherein the BIST circuit is configured to make a go/no-go decision as to at least one performance characteristic of the resonator during the operation to test for a presence of at least one failure mode.

10. The packaged integrated circuit device of claim 1, wherein said BIST circuit is configured to make a go/no-go decision as to at least one performance characteristic of the resonator during the operation to test for a presence of at least one failure mode.

11. The packaged integrated circuit device of claim 1, wherein the operation to test for a presence of at least one failure mode comprises measuring a first characteristic of the resonator under first test conditions and measuring a corresponding first characteristic of a reference element under otherwise equivalent first test conditions.

12. The packaged integrated circuit device of claim 11, wherein
measuring a first characteristic of the resonator under first test conditions comprises measuring a first characteristic of the resonator under first test conditions using a first test circuit including the resonator; and wherein said measuring a corresponding first characteristic of a reference element under equivalent first test conditions comprises measuring a corresponding first characteristic of the reference element under equivalent first test conditions using the first test circuit, with the reference element replacing the resonator therein.

13. The packaged integrated circuit device of claim 12, wherein the reference element is a resistor.

14. The packaged integrated circuit device of claim 1, wherein the resonator is a crystal resonator containing a quartz crystal blank; and wherein the first and second terminals are input and output terminals, respectively, which are electrically connected to respective electrodes on opposing sides of the quartz crystal blank.

15. An integrated circuit device, comprising:
an oscillator circuit comprising a packaged resonating element and a built-in self-test (BIST) circuit electrically coupled to first and second terminals of the resonating element during an operation by said BIST circuit to test at least one performance characteristic of the resonating element during a built-in self-test time interval when said oscillator circuit is at least partially disabled.

16. The integrated circuit device of claim 15, wherein during the operation by said BIST circuit to test at least one performance characteristic of the resonating element the resonating element is temporarily functionally disconnected from other components of said oscillator circuit.

17. A method of operating a packaged integrated circuit device, comprising:
testing at least one performance characteristic of a crystal resonator within the packaged integrated circuit device during a self-test time interval when the crystal resonator is electrically decoupled from oscillator circuitry within the packaged integrated circuit device;
reporting results associated with said testing to an external terminal of the packaged integrated circuit device; and
enabling operation of an oscillator circuit within the packaged integrated circuit device by electrically coupling the crystal resonator to the oscillator circuitry upon expiration of the self-test time interval.

* * * * *